US010788533B2

(12) United States Patent
Kasichainula et al.

(10) Patent No.: US 10,788,533 B2
(45) Date of Patent: Sep. 29, 2020

(54) SYSTEMS AND METHODS FOR BYPASS TESTING

(71) Applicant: Intel Corporation, Santa Clara, CA (US)

(72) Inventors: Kishore Kasichainula, Phoenix, AZ (US); Satheesh Chellappan, Folsom, CA (US); Lay Chen Ong, George Town (MY); Harish G. Kamat, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/116,675

(22) Filed: Aug. 29, 2018

(65) Prior Publication Data

US 2019/0101592 A1 Apr. 4, 2019

(30) Foreign Application Priority Data

Sep. 29, 2017 (MY) .............................. PI2017703698

(51) Int. Cl.
*G01R 31/3185* (2006.01)
*G01R 31/317* (2006.01)
*G01R 31/319* (2006.01)

(52) U.S. Cl.
CPC ............... *G01R 31/318558* (2013.01); *G01R 31/31701* (2013.01); *G01R 31/31723* (2013.01); *G01R 31/31908* (2013.01); *G01R 31/318536* (2013.01); *G01R 31/318555* (2013.01)

(58) Field of Classification Search
CPC ....................................................... G01R 31/31
USPC .......................................................... 714/726
See application file for complete search history.

(56) References Cited

U.S. PATENT DOCUMENTS

| 4,996,691 A | * | 2/1991 | Wilcox | .......... | G01R 31/318536 714/726 |
| 5,592,077 A | * | 1/1997 | Runas | ................ | G01R 31/3004 257/202 |
| 6,000,048 A | * | 12/1999 | Krishna | ............. | G01R 31/3187 714/42 |
| 6,061,507 A | * | 5/2000 | Fitzgerald | ........ | G01R 31/31908 716/136 |
| 6,070,252 A | * | 5/2000 | Xu | ...................... | G01R 31/3183 714/30 |

* cited by examiner

*Primary Examiner* — Fritz Alphonse
(74) *Attorney, Agent, or Firm* — Schwabe, Williamson & Wyatt, P.C.

(57) ABSTRACT

Technology for bypass testing of an integrated circuit using a testing device. The testing device comprising a port configured to connect to an integrated circuit before the integrated circuit is packaged into an end product. The testing device further comprising a controller with architecture configured to bypass a training process designed to be initiated when the integrated circuit is first connected to the port and the port is powered on, confirm a connection between the integrated circuit and the testing device, send a test pattern to the integrated circuit to execute; and receive results from the integrated circuit executing the test pattern.

21 Claims, 7 Drawing Sheets

400

Figure 1A:
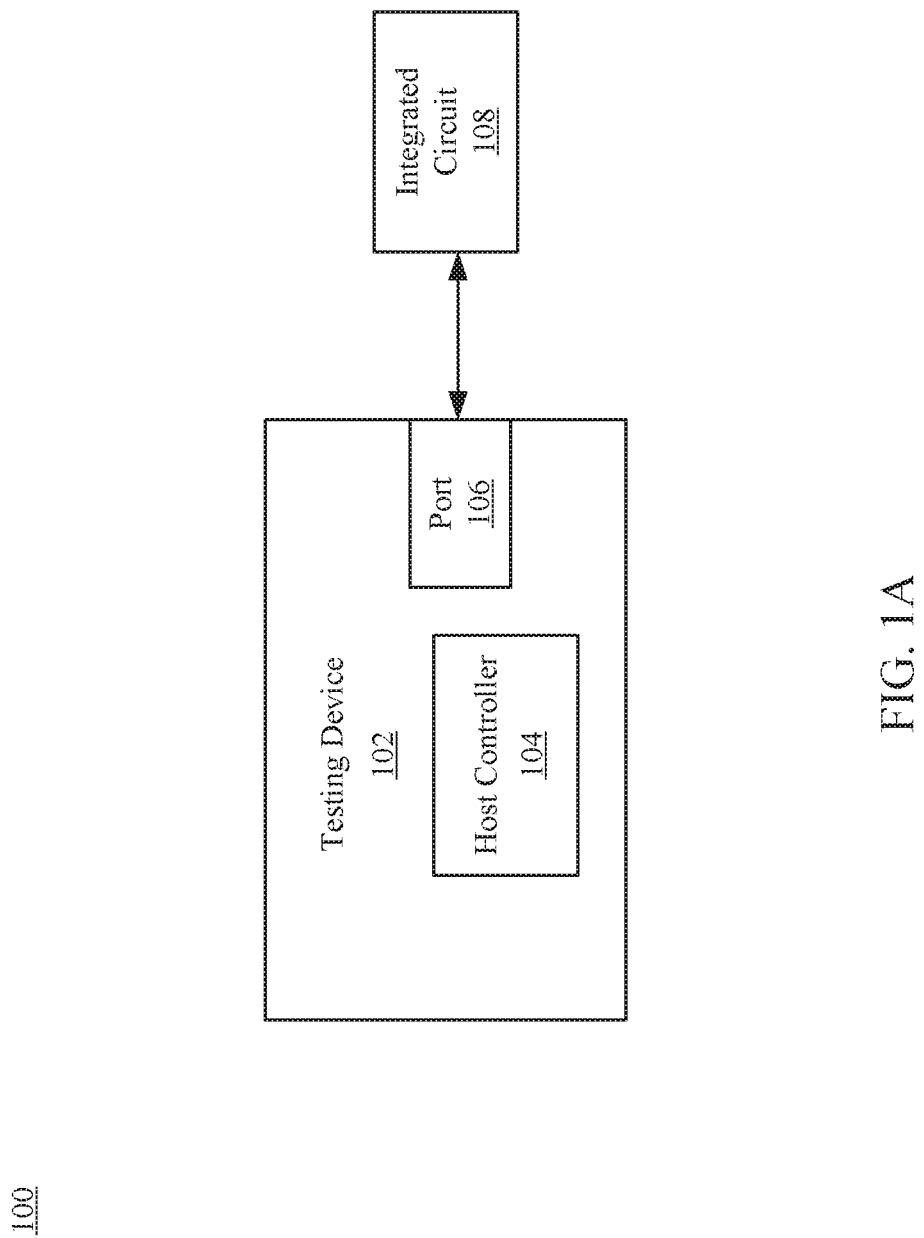

```
┌─────────────────────────────────────────────────────┐
│ Bypassing a training process designed to be         │ ─── 410
│ initiated when an integrated circuit is first       │
│ connected to a port of a testing device             │
│ and the port is powered on                          │
└─────────────────────────────────────────────────────┘
                          │
                          ▼
┌─────────────────────────────────────────────────────┐
│ Confirming a connection between the integrated      │ ─── 420
│ circuit and the testing device via a controller     │
│ of the testing device                               │
└─────────────────────────────────────────────────────┘
                          │
                          ▼
┌─────────────────────────────────────────────────────┐
│ Sending a test pattern to the integrated circuit    │ ─── 430
│ to execute                                          │
└─────────────────────────────────────────────────────┘
                          │
                          ▼
┌─────────────────────────────────────────────────────┐
│ Receiving results from the integrated circuit       │ ─── 440
│ executing the test pattern                          │
└─────────────────────────────────────────────────────┘
```

FIG. 4

SYSTEMS AND METHODS FOR BYPASS TESTING

PRIORITY DATA

This application claims priority to Malaysian Patent Application No. PI 2017703698, filed Sep. 29, 2017, which is incorporated herein by reference in its entirety.

BACKGROUND

As computing systems advance, the components therein generally become more complex. As a result, the interconnect architecture needed to couple the components and allow them to communicate also increases in complexity to ensure that bandwidth requirements are met and component operation is optimized. Computing systems may include input output (I/O) ports, for example a universal serial bus (USB) for transferring data or communications between the computing system and a hardware device. Relevant software drivers can be installed on the computing device to assist or otherwise direct such a process. In many cases, the hardware device includes one or more integrated circuits which require operational testing or verification as part of the manufacturing process. While various techniques have been developed for testing integrated circuits, some testing protocols may have run times that make testing a high volume of integrated circuits costly.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 1A is a block diagram of a testing device for bypass testing of an integrated circuit in accordance with an example embodiment;

FIG. 1B is a block diagram of a testing device with an E-LTSSM for bypass testing of an integrated circuit in accordance with an example embodiment;

FIG. 1C is a block diagram of an integrated circuit with a device controller for bypass testing in accordance with an example embodiment;

FIG. 2 is a block diagram of a sequence for bypass testing of an integrated circuit in accordance with an example embodiment;

FIG. 3 is a flow diagram of a method for bypass testing of an integrated circuit in accordance with an example embodiment;

FIG. 4 is a flow diagram of a method for bypass testing of an integrated circuit in accordance with an example embodiment; and FIG. 5 is a block diagram of an example computer system with a host controller in accordance with another example embodiment.

DESCRIPTION OF EMBODIMENTS

Before invention embodiments are described, it is to be understood that this disclosure is not limited to the structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various invention embodiments. One skilled in the relevant art will recognize, however, that such detailed embodiments do not limit the overall technical concepts articulated herein, but are merely representative thereof.

As used in this written description, the singular forms "a," "an" and "the" include express support for plural referents unless the context clearly dictates otherwise. Thus, for example, reference to "an integrated circuit" includes a plurality of such integrated circuits.

Reference throughout this specification to "an example" means that a particular feature, structure, or characteristic described in connection with the example is included in at least one invention embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of various technology embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as VLSI, FPGAs, or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in at least one embodiment of the present technology. Thus, appearances of the phrases "in an example" or the word "exemplary" in various places throughout this specification are not necessarily all referring to the same embodiment.

EXAMPLE EMBODIMENTS

An initial overview of technology embodiments is provided below and then followed by a description of specific technology embodiments. This initial summary is intended to aid readers in understanding the technology more quickly, but is not intended to identify key or essential features of the technology nor is it intended to limit the scope of the claimed subject matter.

High volume manufacturing (HVM) of devices or components, such as integrated circuits, typically involves function verification and/or quality testing. The testing may occur after the integrated circuit has been manufactured and before being packaged or implemented into a hardware device. Hardware devices can be an end product designed or configured to couple an I/O port associated with a computing system. The testing of the integrated circuit may employ a testing device where the integrated circuit is coupled with a port associated with the testing device and data is exchanged between the testing device and the integrated circuit for testing purposes. The testing is meant to ensure that the integrated circuit is operational and free from errors. The testing may also test the speed of the integrated circuit as well as other functions.

A testing device may have a plurality of ports to simultaneously test a plurality of integrated circuits. The ports of the testing device may include standard ports such as a USB port (e.g. USB, USB 2.0, USB 3.0, 3.1, USB type-C, etc.) or may be modified or have a custom structure or design to test an integrated circuit before the integrated circuit is packaged, since an integrated circuit may not conform to standard port configurations or sizes before packaging into a hardware device. Regardless of the use of a standard or non-standard physical structure or configuration, the protocols and procedures associated with coupling the integrated circuit to the port may be standard. According to some protocols, the testing of the integrated circuit may send a plurality of test patterns to the integrated circuit and the integrated circuit may execute or run the test patterns and send results back to the testing device. Once an integrated circuit is coupled with the port of the testing device, protocols and initiation procedure may take place.

One or more of the testing patterns sent to the integrated circuit may be a training process or training pattern. The test patterns and other training procedures may be sent and controlled by a controller associated with the testing device. During testing of the integrated circuit, the same training process may be sent to the integrated circuit more than once. This may be referred to as full training duration. Additionally, the training process may be repeated for each test pattern that is sent to the integrated circuit. Such redundancy increases the time required to test a given integrated circuit, and may not provide a justifiable benefit. The present technology operates to bypass or otherwise modify the full training process. In one aspect, the testing device employs a host controller with an enhanced Link Training and Status State Machine (E-LTSSM) which may be used with USB, such as USB 3 (e.g. 3.0 or 3.1) or USB-C, and can be expanded to other serial I/O controller protocols such as Serial AT Attachment (SATA), Gigabit Ethernet (GbE), Peripheral Component Interconnect Express (PCIe) with speeds such as 16 megabits per second, Desktop Management Interface (DMI), etc. For example, the present technology may be integrated with devices such as Bluetooth devices or long-term evolution (LTE) modems.

In some embodiments, the bypass may be accomplished when a driver of the testing device turns on power to a port, the E-LTSSM may self-detect and bypass a training process. In one aspect, the training process is bypassed for 99% of the test patterns sent to the integrated circuit. Testing the training process for 1% of the test patterns sent to the integrated circuit ensures that the training process is tested during the testing of a given integrated circuit. Bypassing the training processes reduces redundancy in testing the training process saves time and the cost to test an integrated circuit.

The present technology may also apply to embedded systems. For example, embedded systems may have a need for peer-to-peer communications between controllers associated with the peers. In some embodiments, the controllers can exist on the same or different chips. For example, in smart camera applications, images processed by a Computing Vision Engine (CVE) may need to be stored in cloud storage using an Ethernet. For systems with controllers that do not share a common fabric, the present technology may be employed for achieving communication. In one aspect, the present technology employs a USB 3 standard protocol, but may remove the overhead of a physical layer and may remove enumeration protocol to reduce latency. Thus, the two embedded controllers may be enabled to communicate with each other directly at a link layer level. This may be accomplished using PIPE 4.x protocol, for example. PIPE can refer to Physical layer Interface for the PCI Express, SATA, and USB Architectures where PCI can refer to Peripheral Component Interconnect.

FIG. 1A is a diagram illustrating an environment 100 for testing of an integrated circuit. The environment 100 comprises a testing device 102, a host controller 104, a port 106, and an integrated circuit 108. The testing device 102 may be a device or a system on a chip (SoC) designed to test integrated circuits during a high-volume manufacture process of integrated circuits, including manufacture of the integrated circuit 108. The integrated circuit 108 may be tested by testing device 102 before the integrated circuit 108 is packaged into a hardware device. The testing process may be controlled by the host controller 104. The host controller 104 may be referred to as a high-speed controller or high-speed serial I/O controller. For example, the present technology may be employed with high speed testing including high speeds such as 10 megabits per second. The testing device 102 may also comprise port 106. The port 106 may be designed to physically and/or electrically couple with the integrated circuit 108 for sending and receiving data or communications between the testing device 102 and the integrated circuit 108. The testing device 102 may comprise a plurality of host controllers and a plurality of ports. For example, the testing device 102 may comprise anywhere from 2 to 100 ports for testing a plurality of integrated circuits simultaneously.

The host controller 104 may send test patterns to integrated circuit 108 for purposes of testing the integrated circuit 108. More than 100 test patterns may be sent to the integrated circuit 108 during the testing process. The integrated circuit 108 may run or execute the test patterns. Executing each test pattern at full training or full training duration may cause the integrated circuit 108 to execute or perform the same training process for each test pattern. This may create redundancy in the sort and class stages of the process and increase testing time without providing additional testing coverage for the integrated circuit 108. In some embodiments, the host controller 104 of the present technology may instruct the integrated circuit 108 or control the training process of the integrated circuit 108 such that the test patterns are executed by the integrated circuit 108 while bypassing the training process. In some embodiments, the host controller 104 may instruct the integrated circuit 108 to perform the training process one time, or any number of times, to ensure that the training process is tested. The training process, for example, may be low frequency periodic signaling (LFPS), a polling substrate, or an RxDetect state.

LFPS can refer to standard training sub-state of USB, PCIe, and SATA protocols. The state or sub-state may be used to send commands between a host and a device using low frequency. The polling substrate can refer to a set of sub-states where link training packets are exchanged at high frequency to establish clock recovery and locking between a host and a device. In one example, once the clock is locked, the data bits or symbols may also be locked in these states. The RxDetect sate may refer to a first substrate of training where a remote device attachment is detected when power is applied. The remote device can be a plug-n-play device such as a USB device or integrated an device such as a PCIe device.

In one aspect, the host controller 104 tests the integrated circuit 108 while bypassing the training process for 99% of the tests and test the training process at the integrated circuit 108 for 1% of the tests. This percentage may be adjusted to any desired percentage such as bypassing the training process for 95% of the tests and testing the training process for 5% of the tests. Bypassing the training process for most of the tests and executing the training process for only a low percentage of tests reduces or eliminates redundancy and reduces the amount of time and cost required to test a given integrated circuit. The cost savings may be large when testing a plurality of integrated circuits during high-volume manufacturing (HVM). In one aspect, the present technology may save up to 110 milliseconds per test of the integrated circuit 108. This time savings spread over testing millions of integrated circuits may lead to savings in the millions of dollars. The time savings is further illustrated in Table 1 below:

Table 1

TABLE 1

| State (USB 3.x) | Max/ Timeout | Typical Time Saving |
|---|---|---|
| RxDetect | [not bound] | 100 ms |
| Polling.LFPS | 360 ms | 10 ms |
| Polling.RxEQ | 5 us | 5 us |
| Polling.Active | 12 ms | 10 us |
| Total Time Saving | | 110.015 ms |

In one aspect, the port 106 may or may not conform to physical dimensions associated with a standard port such as a USB port. However, the port 106 may conform to, or be compliant with, the standard protocols associated with standard port. For example, the port 106 may compliant with USB 3 standards or protocols including a USB 3.0, USB 3.1, USB 3.x, etc. In some embodiments, the port 106 may be a high-speed I/O port and may be compliant with any standard I/O port.

Figure 1B:
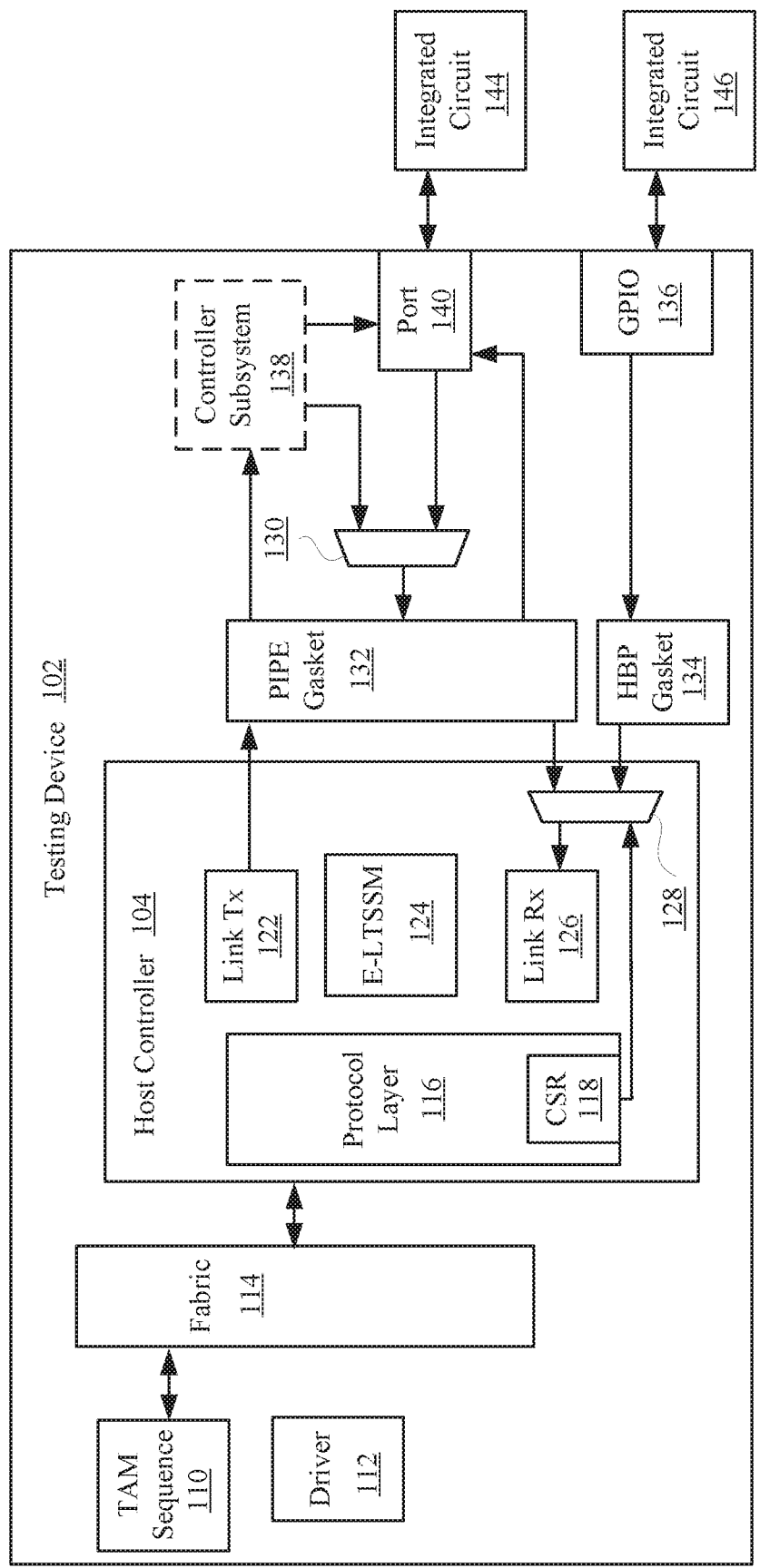

FIG. 1B is a diagram illustrating an environment 120 for testing of an integrated circuit using enhanced LTSSM. Environment 120 may comprise all the features, capabilities, and components of environment 100 of FIG. 1A. Environment 120 comprises testing device 102 for testing an integrated circuit 144 or an integrated circuit 146 which may have all the same features, capabilities, and components of integrated circuit 108 of FIG. 1A. The testing device 102 comprises port 140 which may have all the same features, capabilities, and components of the port 106 of FIG. 1A. The port 140 may be described as a physical layer. In one aspect, the port 140 is a USB 3 physical layer.

The testing device 102 may be described as a subsystem used for testing an integrated circuit. In one aspect, the testing device 102 is a USB subsystem. The testing device 102 comprises the host controller 104 to test the integrated circuit 144. In one aspect, the host controller 104 may be a USB host controller and the host controller 104 and the port 140 form a host subsystem connected to a USB device such as integrated circuit 144. The integrated circuit 144 may be connected to the port 140 via a USB walk-up port and cable.

It should be appreciated that environment 120 illustrates two types of embodiments for bypassing a training process. The first is illustrated in reference to integrated circuit 144 connected to the testing device 102 via the port 140. The integrated circuit 144 is in communication with the host controller 104 via a PIPE gasket 132. This type of embodiment may be described as a USB subsystem. The second is illustrated in reference to integrated circuit 146 which is connected to the testing device 102 via a general-purpose input/output (GPIO) 136. The integrated circuit 146 is in communication with the host controller 104 via a HBP (high speed bypass) gasket 134. This type of embodiment may be described as an HVM application. It should be appreciated that a testing device 102 may employ one or both types of these components for bypass testing.

The host controller 104 may comprise an E-LTSSM 124. The E-LTSSM 124 may be an enhanced Link Training and Status State Machine designed to bypass a training process during the testing of the integrated circuit 144. The E-LTSSM 124 may provide enhancement compared to an LTSSM. The E-LTSSM 124 may bypass RxDetect, which is a synchronization point of the testing device 102 (e.g. host) and the integrated circuit 144 (e.g. the device) in functional mode. This synchronization may not be required for the testing device 102 or for HVM manufacturing process. In one aspect, during usage of the testing device 102, the integrated circuit 144 and the testing device 102 are enabled at the same time by a platform usage.

In one aspect, the E-LTSSM 124 may be enabled once the port 140 is enabled and powered on. For example, when a driver turns on a Vbus on the port 140, there may be no requirement of power delivery to the integrated circuit 144, such as a 5 volt power delivery. In this stage the E-LTSSM may self-detect and bypass a training process such as a LFPS or a polling substrate. For example, the E-LTSSM 124 may bypass polling substrates and jump to Polling.Config stage to negotiate the training set 2 (TS2) ordered sets (OS). For example, Polling.Config may be a stage to handshake TS2 OS and may provide the synchronization point for the host controller 104 and a controller for the integrated circuit 144. The handshake TS2 OS may be link packets exchanged between a host and a device during training. For example, there may be a sequence of ordered sets that are exchanged such as TSEQ, TS1, and TS2. In one aspect, TS2 may be employed as a synchronization point for the present technology. In one aspect, for the testing device 102 enables the host controller 104 and a controller for the integrated circuit 144 at the same time or close to the same time. Link power states may be represented by U0 to U3 where U0 is an active normal state and U3 is the lowest power saving stated defined. The events in U0 and traffic may require that the link timer is triggered at similar time.

In one aspect, a PIPE gasket 132 may be used as a PIPE interface for the host controller 104 to interface with the integrated circuit 144. In one aspect, the PIPE gasket 132 may be a PIPE2 gasket architecture. The PIPE gasket 132 may provide compatible PIPE handshake signals between the integrated circuit 144 and the host controller 104. The controller subsystem 138 may be an optional embedded controller associated with the testing device 102. The controller subsystem 138, if implemented, may service the software stack associated with the integrated circuit 144 or other device coupled with the port 140. The controller subsystem 138 and the port 140 may communicate with the PIPE gasket 132 via an interface 130. In one aspect, the PIPE gasket 132 may only be applicable in specific applications of the present technology. For example, if PIPE receiver signals are directly driven from a GPIO such as the signals for integrated circuit 146 driven from GPIO 136. The GPIO 136 may have the same features as port 140. The PIPE gasket 132 may be employed in embodiments to handle controls associated with the port 140 such as rx_elec_idle, phy_status, rx status and power_down. The PIPE gasket 132 may also manage lane sharing in the testing device 102 or muxing of functional lane and HVM data path. The PIPE gasket 132 may also handle pipe_clk and pipe_reset, which is per port or common for all the ports in the host controller 104. Additional, during link low power stages, the PIPE gasket 132 may handle the power_down and phy_status transitions and clock management. In some embodiments, the PIPE gasket 132 handles a power down of the link during S0ix/ConnectedStandy.

The host controller 104 may further comprise a link Tx 122 for transmitting data to the PIPE gasket 132. A link Rx 126 may be used for receiving data over the interface 128 from the PIPE gasket 132, HBP gasket 134, and/or protocol layer 116. The protocol layer 116 may be described as the layer that handles the USB tokens, data and handshakes. The protocol layer 116 may comprise a control and status register (CSR) 118 used to store information. For example, the CSR 118 may provide capability and Memory-mapped input output (MMIO) registers for the host controller 104. In one aspect, enable, overrides, and status registers can be added to the protocol layer 116 and may be added along with standard xHCI and private registers.

In one aspect, a TAM sequence 110 and an HBP gasket 134 may be optionally employed for testing an integrated circuit in an HVM process. The TAM sequence 110 may connect to the host controller 104 via a fabric 114. The fabric 114 may be described as a primary fabric interface that is employed to physically couple hardware components. The TAM sequence 110 may be described as a test access method (TAM) sequence that may be employed to generate test patterns from a primary fabric side of the fabric 114. The TAM sequence 110 may be employed to drive host transactions such as programming the registers, setting up an endpoint and initiating the transfers, etc. In one aspect, the TAM sequence 110 generates test patterns for the integrated circuit to execute. The primary fabric side of the fabric 114 may also comprise a driver 112 which may be an xHCI drive. The HBP gasket 134 may convert a pattern from the PIPE side and generate a receiver datapath for connect synchronization and U0 traffic. For example, the U0 traffic may be Logical Idle, Link and Protocol packets. The HBP gasket 134 may also manage a power management (PM) sequence such as U1/U2/U3 USB link power state and disconnect.

Methods for bypassing a training process employing the components of environment 120 may begin with a power on sequence. First, the host controller 104 and the integrated circuit 144 are coupled. The power rails of the PIPE gasket 132, the host controller 104 and the controller subsystem 138 are turned on or activated. Next, the always on (AON) reset is released and VNN resets in both partitions. For example, the AON may be a deep power state such that the sequence of power on starts from AON and other power rails. Similarly when powering down AON may be the last to power down. Other examples of power rails may be VNN which may refer to normal active rails and when that power is up the resets will be sequenced. Next, the xHCI register, slot, endpoint and event data structures for the host controller 104 are initialized. Next, the port 140 and the integrated circuit are enabled. This may occur in concurrent threads. The registers and configuration of the integrated circuit 144 controllers are enabled which triggers the E-LTSSM 124. Then the port 140 is enabled and the host port power is enabled which triggers the E-LTSSM 124 on the host controller 104. Next, the link reaches U0 and normal functionality continues. A recovery entry because of link error may not be applicable in these usages because there may be no link error possible in point to point on-chip communications. A recovery entry during LP link states such as U1/U2/U3 may bypass a recovery. For active, the bypass may be optional. In order to reduce the recovery, the next step may be to exit latency. Next, the PIPE gasket 132 may manage the power_down and phy_status handshake between the host controller 104 and the controller for the integrated circuit 144 during LP link state entries and exit the power_down and phy_status handshake.

Figure 1C:
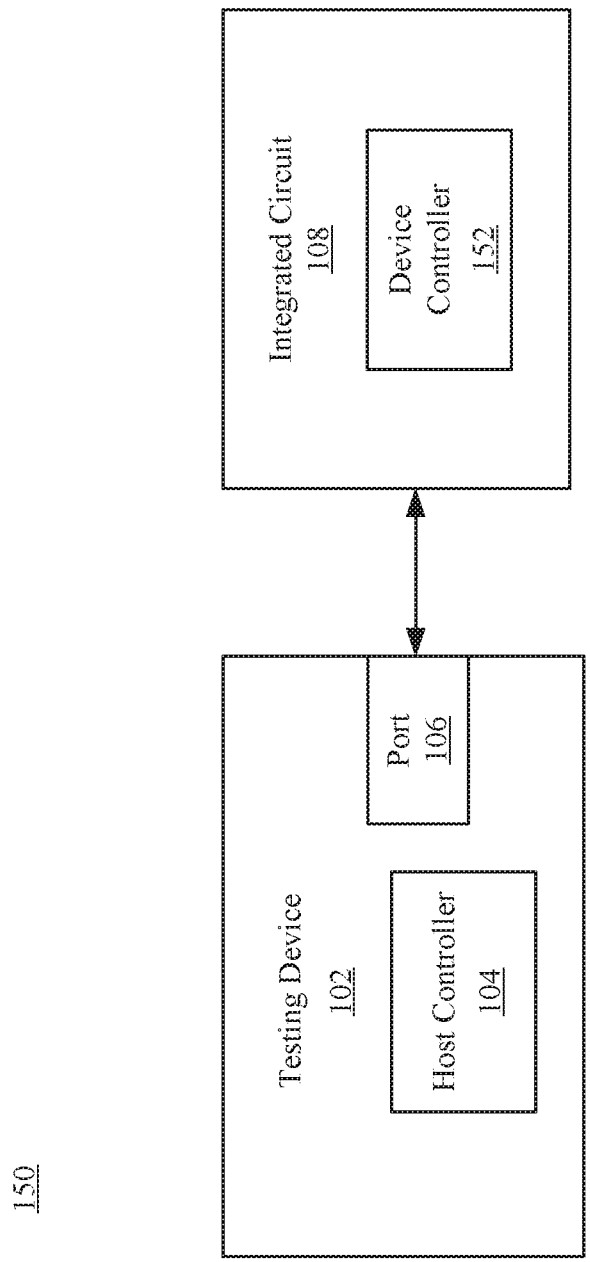

FIG. 1C is a diagram illustrating an environment 120 for bypass testing of an integrated circuit with a device controller. Environment 150 may comprise all the features, capabilities, and components of environment 100 of FIG. 1A and environment 120 of FIG. 1B. Environment 150 comprises the integrated circuit 144 with a device controller 152. The device controller 152 may comprise architecture to carry out bypass testing in accordance with the present technology. For example, the device controller may have architecture similar to the host controller 104. In some embodiments, the device controller 152 may be a device controller for a USB 3 device. In one aspect, the timing and protocol for bypassing testing via the device controller 152 may be reversed compared to the timing and protocol for the testing device 102 and host controller 104.

Figure 2:
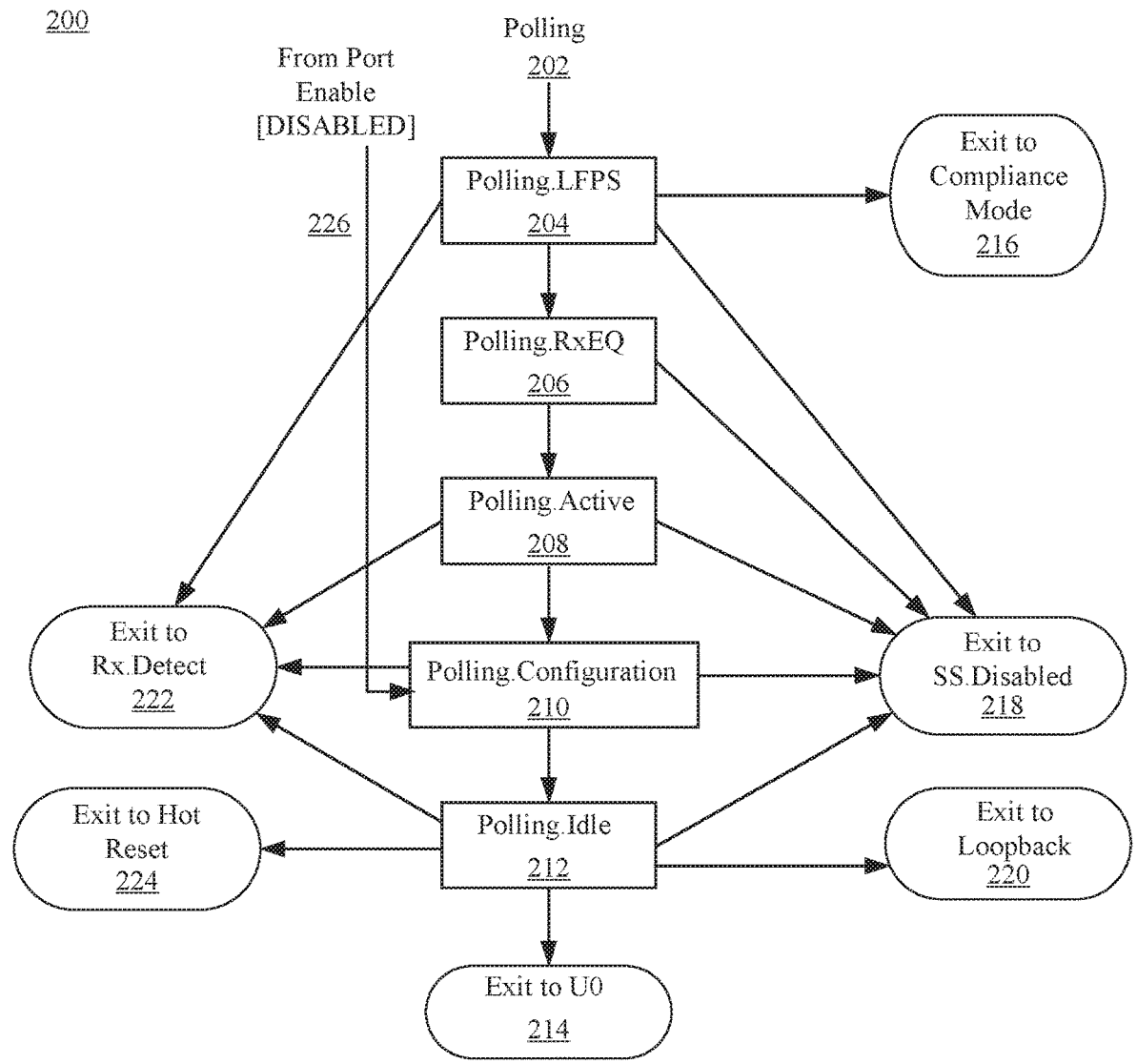

FIG. 2 is a diagram illustrating a sequence 200 for a polling substrate machine performing a sequence or sequences for bypassing a training process in accordance with an example embodiment. The sequence 200 may be described as a power on sequence used to bypass training processes such as a polling substrate. It should be appreciated that sequence 200 is for illustrative purposes and may not include all transition conditions for bypass testing. The E-LTSSM 124 of FIG. 1B may be employed for the byspass. Once the host controller and the integrated circuit are powered on, the E-LTSSM may self-detect.

The polling may begin at polling 202. At Polling.LFPS 204, the E-LTSSM may direct the integrated circuit to exit to compliance mode 216 at the first LFPS timeout. The E-LTSSM may direct the integrated circuit to exit to Rx.Detect 222 after Polling.LFPS 204 for subsequent LFPS timeouts for DS Port ONLY or Hub US Port. Alternatively, Polling.LFPS 204 may proceed to Polling.RxEQ 206 which may be described as a LFPS handshake.

The E-LTSSM may direct the integrated circuit to exit to SS.Disabled 218 after Polling.RxEQ 206 or the integrated circuit may proceed to Polling.Active 208 which may be described as TSE Q ordered sets transmitted. The E-LTSSM may direct the integrated circuit to exit to SS.Disabled 218 for a DS Port ONLY for a timeout directed for a peripheral device ONLY at Polling.Active 208 or exit to Rx.Detect 222 for DS Port ONLY or Hub US Port. Alternatively, after Polling.Active 208 the integrated circuit may proceed to Polling.Configuration 210 which may take place after 8 consecutive TS1 or TS2 are received.

In some embodiments, the E-LTSSM may direct the integrated circuit to exit to Rx.Detect 222 for a DS Port ONLY or Hub US Port for a timeout at Polling.Configuration 210. The E-LTSSM may direct the integrated circuit to exit to SS.Disabled 218 for a DS Port ONLY for a timeout directed for a peripheral device ONLY at Polling.Configuration 210. Alternatively, after Polling.Configuration 210 the integrated circuit may proceed to Polling.Idle 212 which may be described as a TS2 handshake.

The E-LTSSM may direct the integrated circuit to exit to Rx.Detect 222 for DS Port ONLY or Hub US Port for a timeout at Polling.Idle 212. The E-LTSSM may direct the integrated circuit to exit to SS.Disabled 218 for a DS Port ONLY for a timeout directed for a peripheral device ONLY at Polling.Idle 212. The integrated circuit may be direct to exit to hot reset 224 at Polling.Idle 212. The integrated circuit may be direct to exit to loopback 220 at Polling.Idle 212. Alternatively, after Polling.Idle 212 the integrated circuit may exit to U0 214 which may be described as an idle symbol handshake.

In one aspect, the integrated circuit may be directed by the E-LTSSM to disable the Port Enable. This allows the integrated circuit to bypass Polling.LFPS 204, Polling.RxEQ 206, Polling.Active 208, and go directly to Polling.Configuration 210 as is demonstrated by arrow 228.

Figure 3:
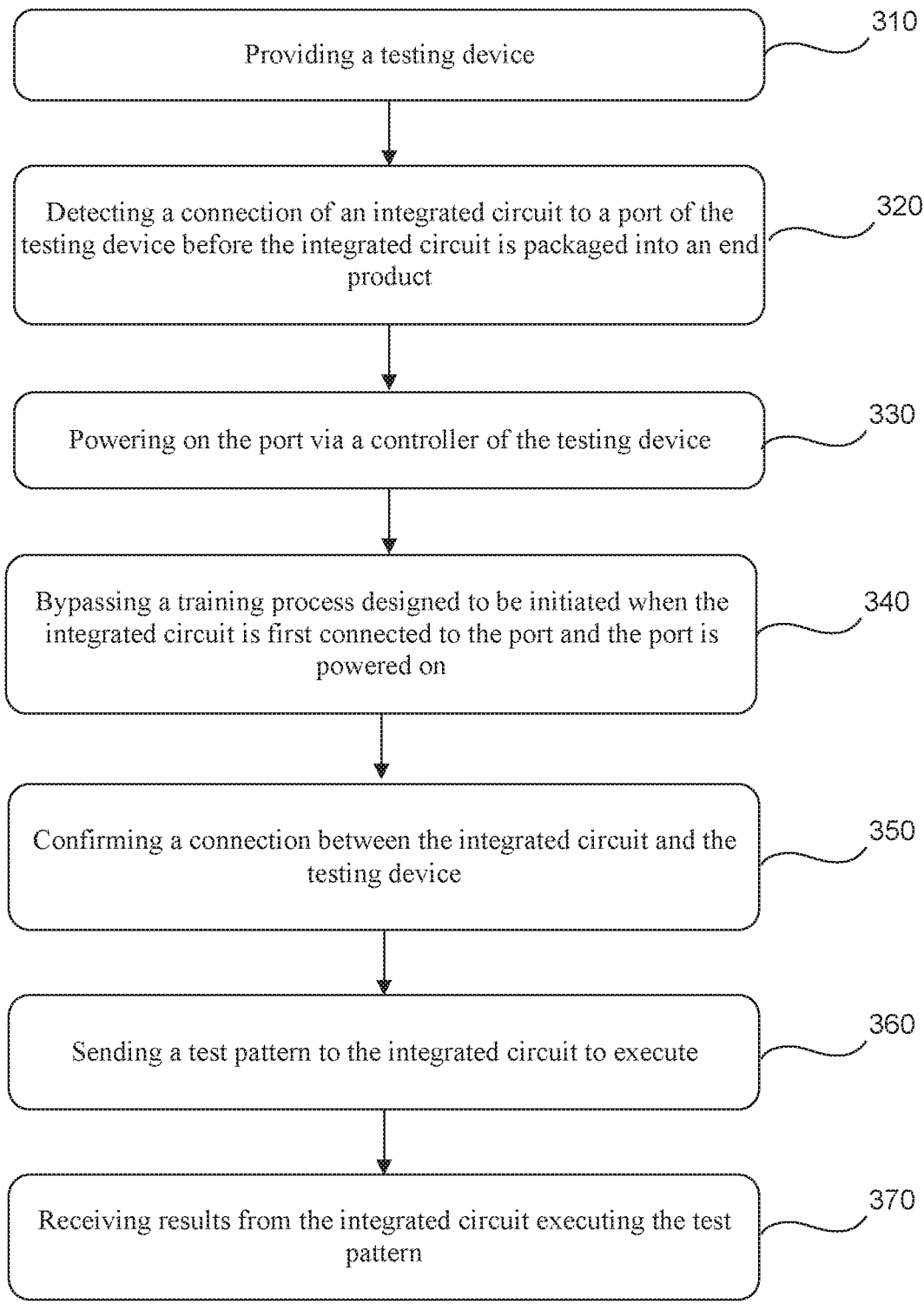

FIG. 3 illustrates a flow diagrams of methods or operations for bypass testing in accordance with example embodiments. The functionality 300 may be implemented as a method and executed as instructions on a machine, where the instructions are included on at least one computer readable medium or one non-transitory machine-readable storage medium. For example, starting in block 310, a testing device is provided. The testing device may be testing device 102 as referred to in FIGS. 1A-C. A connection of an integrated circuit to a port of the testing device is detected before the integrated circuit is packaged into an end product, as in block 320. The port is powered on via a controller of the testing device, as in block 330. A training process designed to be initiated when the integrated circuit is first connected to the port and the port is powered on is bypassed, as in block 340. A connection between the integrated circuit and the testing device is confirmed, as in block 350. A test pattern is sent to the integrated circuit to execute, as in block 360. Results are received from the integrated circuit executing the test pattern, as in block 370.

FIG. 4 illustrates a flow diagram of methods or operations for bypass testing in accordance with example embodiments. The functionality 400 may be implemented as a method and executed as instructions on a machine, where the instructions are included on at least one computer readable medium or one non-transitory machine-readable storage medium. For example, starting in block 410 a training process designed to be initiated when an integrated circuit is first connected to a port of a testing device and the port is powered on is bypassed. A connection between the integrated circuit and the testing device is confirmed via a controller of the testing device, as in block 420. A test pattern is sent to the integrated circuit to execute, as in block 430. Results are received from the integrated circuit executing the test pattern, as in block 440.

Figure 5:
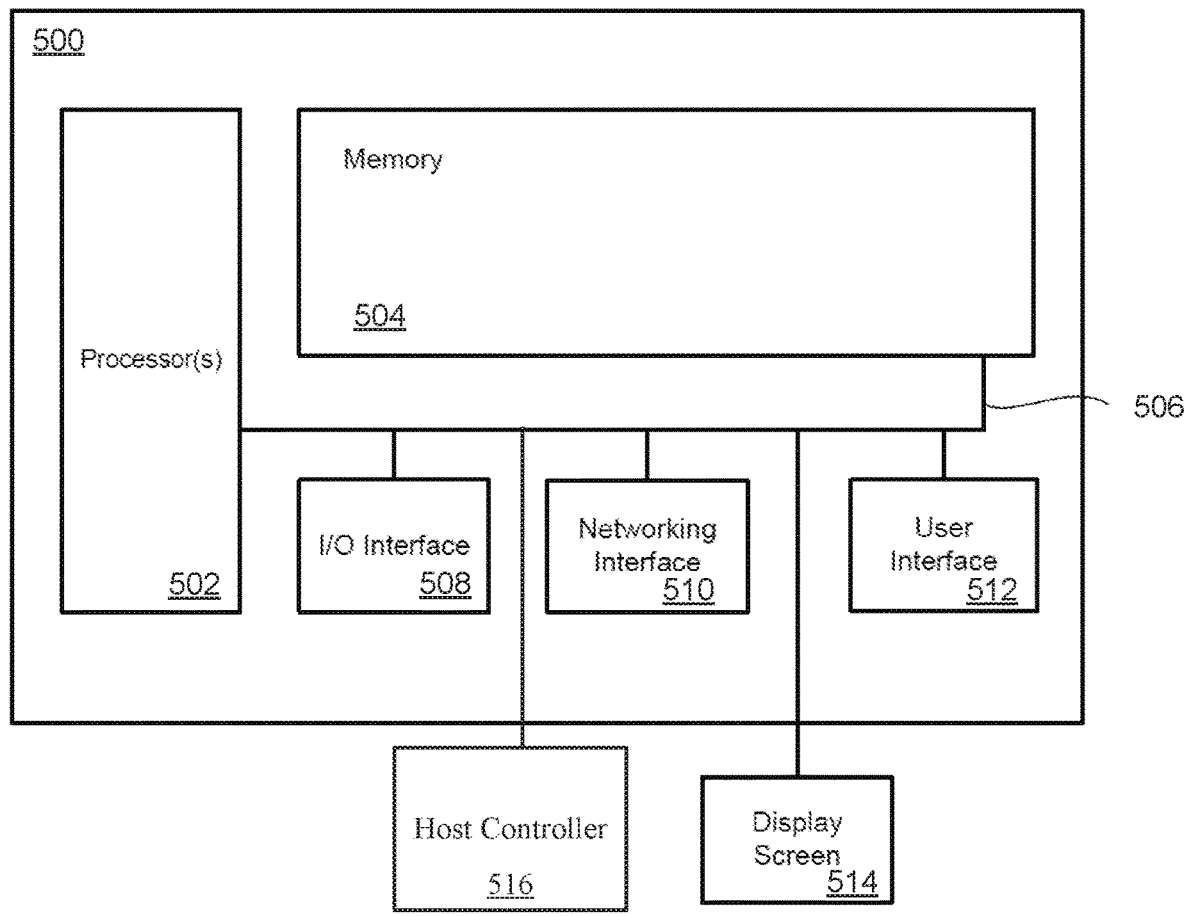

FIG. 5 depicts an exemplary system upon which embodiments of the present disclosure may be implemented. For example, the system of FIG. 5 may be a computer system or a testing device. The system can include a memory controller 502, a plurality of memory 504, a processor 506, and circuitry 508. The circuitry can be configured to implement the hardware described herein for the testing device 102 or the integrated circuits of FIGS. 1A-C. Various embodiments of such systems for FIG. 5 can include smart phones, laptop computers, handheld and tablet devices, CPU systems, SoC systems, server systems, networking systems, storage systems, high capacity memory systems, or any other computational system.

The system can also include an I/O (input/output) interface 510 for controlling the I/O functions of the system, as well as for I/O connectivity to devices outside of the system.

A network interface can also be included for network connectivity, either as a separate interface or as part of the I/O interface 510. The network interface can control network communications both within the system and outside of the system. The network interface can include a wired interface, a wireless interface, a Bluetooth interface, optical interface, and the like, including appropriate combinations thereof. Furthermore, the system can additionally include various user interfaces, display devices, as well as various other components that would be beneficial for such a system.

The system can also include memory in addition to memory 504 that can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The processor 506 can be a single or multiple processors, and the memory can be a single or multiple memories. The local communication interface can be used as a pathway to facilitate communication between any of a single processor, multiple processors, a single memory, multiple memories, the various interfaces, and the like, in any useful combination.

The system can also include a user interface 512 a graphical user interface for interacting with the user. The system can also include a display screen 514 for displaying images and the user interface 512. The system can also include host controller 516 for testing an integrated circuit.

The disclosed embodiments may be implemented, in some cases, in hardware, firmware, software, or any combination thereof. Portions of the disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

EXAMPLES

The following examples pertain to specific technology embodiments and point out specific features, elements, or steps that may be used or otherwise combined in achieving such embodiments.

In one example there is provided, a testing device for testing an integrated circuit comprising a port configured to connect to an integrated circuit before the integrated circuit is packaged into an end product; and a controller with architecture configured to bypass a training process designed to be initiated when the integrated circuit is first connected to the port and the port is powered on; confirm a connection between the integrated circuit and the testing device; send a test pattern to the integrated circuit to execute; and receive results from the integrated circuit executing the test pattern.

In one example of a testing device for testing an integrated circuit, the test pattern comprises a plurality of test patterns.

In one example of a testing device for testing an integrated circuit, at least one of the plurality of test patterns is configured to test the training process.

In one example of a testing device for testing an integrated circuit, the testing device comprises a plurality of ports for testing a plurality of integrated circuits.

In one example of a testing device for testing an integrated circuit, the test pattern is generated by a test access mechanism (TAM) DFx.

In one example of a testing device for testing an integrated circuit, the controller is further configured to bypass a plurality of training processes.

In one example of a testing device for testing an integrated circuit, the controller is configured to optionally bypass or not bypass the training process.

In one example of a testing device for testing an integrated circuit, the training process is low frequency periodic signaling (LFPS).

In one example of a testing device for testing an integrated circuit, the training process is a polling substrate.

In one example of a testing device for testing an integrated circuit, the training process is an RxDetect state.

In one example of a testing device for testing an integrated circuit, the training process is a synchronization point.

In one example of a testing device for testing an integrated circuit, the port is selected from the group of ports consisting of: a universal serial bus (USB) 3 port, a serial ATA (SATA) port, and a peripheral component interconnect express (PCIe) port.

In one example of a testing device for testing an integrated circuit, the controller is a link training and status state machine with specific purpose hardware.

In one example of a testing device for testing an integrated circuit, the controller interfaces with the port via a pipe gasket.

In one example of a testing device for testing an integrated circuit, the connection is confirmed between the integrated circuit and the testing device via a pipe signal handshake.

In one example of a testing device for testing an integrated circuit, the connection is confirmed between the integrated circuit and the testing device via a polling config stage.

In one example of a testing device for testing an integrated circuit, the port is an input/output port.

In one example of a testing device for testing an integrated circuit, the controller is further configured to power on the port and control the port before the training process is bypassed.

In one example there is provided, a method for testing an integrated circuit including providing a testing device as recited above; detecting a connection of an integrated circuit to a port of the testing device before the integrated circuit is packaged into an end product; powering on the port via a controller of the testing device; bypassing a training process designed to be initiated when the integrated circuit is first connected to the port and the port is powered on; confirming a connection between the integrated circuit and the testing device; sending a test pattern to the integrated circuit to execute; and receiving results from the integrated circuit executing the test pattern.

In one example of a method for testing an integrated circuit, the method further comprises the test pattern comprises a plurality of test patterns.

In one example of a method for testing an integrated circuit, the method further comprises at least one of the plurality of test patterns is configured to test the training process.

In one example of a method for testing an integrated circuit, the method further comprises the testing device comprises a plurality of ports for testing a plurality of integrated circuits.

In one example of a method for testing an integrated circuit, the method further comprises the test pattern is generated by a test access mechanism (TAM) DFx.

In one example of a method for testing an integrated circuit, the method further comprises the bypassing comprises bypassing a plurality of training processes.

In one example of a method for testing an integrated circuit, the method further comprises the bypassing is optionally turned on or off via the controller.

In one example of a method for testing an integrated circuit, the method further comprises the training process is low frequency periodic signaling (LFPS).

In one example of a method for testing an integrated circuit, the method further comprises the training process is a polling substrate.

In one example of a method for testing an integrated circuit, the method further comprises the training process is an RxDetect state.

In one example of a method for testing an integrated circuit, the method further comprises the training process is a synchronization point.

In one example of a method for testing an integrated circuit, the method further comprises the port is selected from the group of ports consisting of: a universal serial bus (USB) 3 port, a serial ATA (SATA) port, and a peripheral component interconnect express (PCIe) port.

In one example of a method for testing an integrated circuit, the method further comprises the controller is a link training and status state machine with specific purpose hardware.

In one example of a method for testing an integrated circuit, the method further comprises the controller interfaces with the port via a pipe gasket.

In one example of a method for testing an integrated circuit, the method further comprises the confirming the connection between the integrated circuit and the testing device is accomplished via a pipe signal handshake.

In one example of a method for testing an integrated circuit, the method further comprises the confirming the connection between the integrated circuit and the testing device is accomplished via a polling config stage.

In one example of a method for testing an integrated circuit, the method further comprises the port is an input/output port.

In one example there is provided, a method for testing an integrated circuit including bypassing a training process designed to be initiated when an integrated circuit is first connected to a port of a testing device and the port is powered on; confirming a connection between the integrated circuit and the testing device via a controller of the testing device; sending a test pattern to the integrated circuit to execute; and receiving results from the integrated circuit executing the test pattern.

In one example of a method for testing an integrated circuit, the test pattern comprises a plurality of test patterns.

In one example of a method for testing an integrated circuit, at least one of the plurality of test patterns is configured to test the training process.

In one example of a method for testing an integrated circuit, the testing device comprises a plurality of ports for testing a plurality of integrated circuits.

In one example of a method for testing an integrated circuit, the test pattern is generated by a test access mechanism (TAM) DFx.

In one example of a method for testing an integrated circuit, the bypassing comprises bypassing a plurality of training processes.

In one example of a method for testing an integrated circuit, the bypassing is optionally turned on or off via the controller.

In one example of a method for testing an integrated circuit, the training process is low frequency periodic signaling (LFPS).

In one example of a method for testing an integrated circuit, the training process is a polling substrate.

In one example of a method for testing an integrated circuit, the training process is an RxDetect state.

In one example of a method for testing an integrated circuit, the training process is a synchronization point.

In one example of a method for testing an integrated circuit, the port is selected from the group of ports consisting of: a universal serial bus (USB) 3 port, a serial ATA (SATA) port, and a peripheral component interconnect express (PCIe) port.

In one example of a method for testing an integrated circuit, the controller is a link training and status state machine with specific purpose hardware.

In one example of a method for testing an integrated circuit, the controller interfaces with the port via a pipe gasket.

In one example of a method for testing an integrated circuit, the confirming the connection between the integrated circuit and the testing device is accomplished via a pipe signal handshake.

In one example of a method for testing an integrated circuit, the confirming the connection between the integrated circuit and the testing device is accomplished via a polling config stage.

In one example of a method for testing an integrated circuit, the port is an input/output port.

In one example of a method for testing an integrated circuit, powering on the port via a controller of the testing device.

In one example there is provided, an integrated circuit comprising: a device controller with architecture configured to: bypass a training process designed to be initiated when the integrated circuit is first connected to a port of a testing device and the port is powered on; confirm a connection between the integrated circuit and the testing device; receive a test pattern from a host controller associated with the testing device; and send results from executing the test pattern to the testing device.

In one example of an integrated circuit the test pattern comprises a plurality of test patterns.

In one example of an integrated circuit at least one of the plurality of test patterns is configured to test the training process.

In one example of an integrated circuit the test pattern is generated by a test access mechanism (TAM) DFx.

In one example of an integrated circuit the device controller is further configured to bypass a plurality of training processes.

In one example of an integrated circuit the device controller is configured to optionally bypass or not bypass the training process.

In one example of an integrated circuit the training process is low frequency periodic signaling (LFPS).

In one example of an integrated circuit the training process is a polling substrate.

In one example of an integrated circuit the training process is an RxDetect state.

In one example of an integrated circuit the training process is a synchronization point.

In one example of an integrated circuit the port is selected from the group of ports consisting of: a universal serial bus (USB) 3 port, a serial ATA (SATA) port, and a peripheral component interconnect express (PCIe) port.

In one example of an integrated circuit the device controller is a link training and status state machine with specific purpose hardware.

In one example of an integrated circuit the device controller interfaces with the port via a pipe gasket.

In one example of an integrated circuit the device controller is further configured to power on the port and control the port before the training process is bypassed.

In one example there is provided, a non-transitory machine readable storage medium having instructions embodied thereon, the instructions when executed cause a processor to perform testing an integrated circuit, comprising: providing a testing device; detecting a connection of an integrated circuit to a port of the testing device before the integrated circuit is packaged into an end product; powering on the port via a controller of the testing device; bypassing a training process designed to be initiated when the integrated circuit is first connected to the port and the port is powered on; confirming a connection between the integrated circuit and the testing device; sending a test pattern to the integrated circuit to execute; and receiving results from the integrated circuit executing the test pattern.

In one example there is provided, a non-transitory machine readable storage medium wherein the test pattern comprises a plurality of test patterns.

In one example there is provided, a non-transitory machine readable storage medium wherein at least one of the plurality of test patterns is configured to test the training process.

In one example there is provided, a non-transitory machine readable storage medium wherein the testing device comprises a plurality of ports for testing a plurality of integrated circuits.

In one example there is provided, a non-transitory machine readable storage medium wherein the test pattern is generated by a test access mechanism (TAM) DFx.

In one example there is provided, a non-transitory machine readable storage medium wherein the bypassing comprises bypassing a plurality of training processes.

In one example there is provided, a non-transitory machine readable storage medium wherein the bypassing is optionally turned on or off via the controller.

In one example there is provided, a non-transitory machine readable storage medium wherein the training process is low frequency periodic signaling (LFPS).

In one example there is provided, a non-transitory machine readable storage medium wherein the training process is a polling substrate.

In one example there is provided, a non-transitory machine readable storage medium wherein the training process is an RxDetect state.

In one example there is provided, a non-transitory machine readable storage medium wherein the training process is a synchronization point.

In one example there is provided, a non-transitory machine readable storage medium wherein the port is selected from the group of ports consisting of: a universal serial bus (USB) 3 port, a serial ATA (SATA) port, and a peripheral component interconnect express (PCIe) port.

In one example there is provided, a non-transitory machine readable storage medium wherein the controller is a link training and status state machine with specific purpose hardware.

In one example there is provided, a non-transitory machine readable storage medium wherein the controller interfaces with the port via a pipe gasket.

In one example there is provided, a non-transitory machine readable storage medium wherein the confirming the connection between the integrated circuit and the testing device is accomplished via a pipe signal handshake.

In one example there is provided, a non-transitory machine readable storage medium wherein the confirming the connection between the integrated circuit and the testing device is accomplished via a polling config stage.

In one example there is provided, a non-transitory machine readable storage medium wherein the port is an input/output port.

In one example there is provided, a non-transitory machine readable storage medium having instructions embodied thereon, the instructions when executed cause a processor to perform testing an integrated circuit, comprising: bypassing a training process designed to be initiated when an integrated circuit is first connected to a port of a testing device and the port is powered on; confirming a connection between the integrated circuit and the testing device via a controller of the testing device; sending a test pattern to the integrated circuit to execute; and receiving results from the integrated circuit executing the test pattern.

In one example there is provided, a non-transitory machine readable storage medium wherein the test pattern comprises a plurality of test patterns.

In one example there is provided, non-transitory machine readable storage medium wherein at least one of the plurality of test patterns is configured to test the training process.

In one example there is provided, a non-transitory machine readable storage medium wherein the testing device comprises a plurality of ports for testing a plurality of integrated circuits.

In one example there is provided, a non-transitory machine readable storage medium wherein the test pattern is generated by a test access mechanism (TAM) DFx.

In one example there is provided, a non-transitory machine readable storage medium wherein the bypassing comprises bypassing a plurality of training processes.

In one example there is provided, a non-transitory machine readable storage medium wherein the bypassing is optionally turned on or off via the controller.

In one example there is provided, a non-transitory machine readable storage medium wherein the training process is low frequency periodic signaling (LFPS).

In one example there is provided, a non-transitory machine readable storage medium wherein the training process is a polling substrate.

In one example there is provided, a non-transitory machine readable storage medium wherein the training process is an RxDetect state.

In one example there is provided, a non-transitory machine readable storage medium wherein the training process is a synchronization point.

In one example there is provided, a non-transitory machine readable storage medium wherein the port is selected from the group of ports consisting of: a universal serial bus (USB) 3 port, a serial ATA (SATA) port, and a peripheral component interconnect express (PCIe) port.

In one example there is provided, a non-transitory machine readable storage medium wherein the controller is a link training and status state machine with specific purpose hardware.

In one example there is provided, a non-transitory machine readable storage medium wherein the controller interfaces with the port via a pipe gasket.

In one example there is provided, a non-transitory machine readable storage medium wherein the confirming the connection between the integrated circuit and the testing device is accomplished via a pipe signal handshake.

In one example there is provided, a non-transitory machine readable storage medium wherein the confirming the connection between the integrated circuit and the testing device is accomplished via a polling config stage.

In one example there is provided, a non-transitory machine readable storage medium wherein the port is an input/output port.

In one example there is provided, a non-transitory machine readable storage medium further comprising: powering on the port via a controller of the testing device.

What is claimed is:

1. A testing device for testing an integrated circuit, comprising:
   a port configured to connect to an integrated circuit before the integrated circuit is packaged into an end product; and
   a controller with architecture configured to:
   bypass a training process designed to be initiated when the integrated circuit is first connected to the port and the port is powered on;
   confirm a connection between the integrated circuit and the testing device;
   send a test pattern to the integrated circuit to execute; and
   receive results from the integrated circuit executing the test pattern;
   wherein the training process comprises at least one of low frequency periodic signaling (LFPS), a polling sub-state, an RxDetect state, or a synchronization point.

2. The testing device as recited in claim 1, wherein the test pattern comprises a plurality of test patterns.

3. The testing device as recited in claim 2, wherein at least one of the plurality of test patterns is configured to test the training process.

4. The testing device as recited in claim 1, wherein the testing device comprises a plurality of ports for testing a plurality of integrated circuits.

5. The testing device as recited in claim 1, wherein the test pattern is generated by a test access mechanism (TAM) DFx.

6. The testing device as recited in claim 1, wherein the controller is further configured to bypass a plurality of training processes.

7. The testing device as recited in claim 1, wherein the controller is configured to optionally bypass or not bypass the training process.

8. The testing device as recited in claim 1, wherein the port is selected from the group of ports consisting of: a universal serial bus (USB) 3 port, a serial ATA (SATA) port, and a peripheral component interconnect express (PCIe) port.

9. The testing device as recited in claim 1, wherein the controller is a link training and status state machine with specific purpose hardware.

10. The testing device as recited in claim 1, wherein the controller interfaces with the port via a pipe gasket.

11. The testing device as recited in claim 1, wherein the connection is confirmed between the integrated circuit and the testing device via a pipe signal handshake.

12. The testing device as recited in claim 1, wherein the connection is confirmed between the integrated circuit and the testing device via a polling config stage.

13. The testing device as recited in claim 1, wherein the port is an input/output port.

14. The testing device as recited in claim 1, wherein the controller is further configured to power on the port and control the port before the training process is bypassed.

15. A method for testing an integrated circuit, comprising:
   bypassing a training process designed to be initiated when an integrated circuit is first connected to a port of a testing device and the port is powered on;
   confirming a connection between the integrated circuit and the testing device via a controller of the testing device;
   sending a test pattern to the integrated circuit to execute; and
   receiving results from the integrated circuit executing the test pattern;
   wherein the training process comprises at least one of low frequency periodic signaling (LFPS), a polling sub-state, or an RxDetect state.

16. The method as recited in claim 15, wherein the test pattern comprises a plurality of test patterns.

17. The method as recited in claim 15, wherein the test pattern is generated by a test access mechanism (TAM) DFx.

18. The method as recited in claim 15, wherein the bypassing comprises bypassing a plurality of training processes.

19. The method as recited in claim 15, wherein the controller is a link training and status state machine with specific purpose hardware.

20. The method as recited in claim 15, wherein the confirming the connection between the integrated circuit and the testing device is accomplished via a pipe signal handshake.

21. The method as recited in claim 15, wherein the confirming the connection between the integrated circuit and the testing device is accomplished via a polling config stage.

* * * * *